(12) United States Patent
Chang

(10) Patent No.: US 11,259,400 B1
(45) Date of Patent: Feb. 22, 2022

(54) CIRCUIT BOARD

(71) Applicant: HTC Corporation, Taoyuan (TW)

(72) Inventor: Che-Jung Chang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 17/033,698

(22) Filed: Sep. 26, 2020

(51) Int. Cl.
*H05K 1/02* (2006.01)

(52) U.S. Cl.
CPC .................. *H05K 1/0224* (2013.01)

(58) Field of Classification Search
CPC .......................... H05K 1/0225; H05K 1/0224
See application file for complete search history.

(56) References Cited

U.S. PATENT DOCUMENTS

| | | | | |
|---|---|---|---|---|
| 2017/0318665 | A1* | 11/2017 | Bois | H05K 1/0225 |
| 2018/0350748 | A1* | 12/2018 | Cheah | H01L 21/565 |
| 2018/0376580 | A1* | 12/2018 | Xing | H03H 1/0007 |
| 2019/0166685 | A1* | 5/2019 | Lee | H05K 1/0224 |

FOREIGN PATENT DOCUMENTS

TW 201707522 2/2017

OTHER PUBLICATIONS

"Office Action of Taiwan Counterpart Application", dated Jun. 4, 2021, p. 1-p. 6.

* cited by examiner

*Primary Examiner* — Hoa C Nguyen
*Assistant Examiner* — Amol H Patel
(74) *Attorney, Agent, or Firm* — JCIPRNET

(57) ABSTRACT

A circuit including a grounding layer, a pair of signal lines and an insulating layer is provided. The grounding layer has a void region. The void region includes a first straight line part, a second straight line part and a third straight line part. The second straight line part and the third straight line part are connected to two ends of the first straight line part. An orthogonal projection of the pair of signal lines on the grounding layer crosses the first straight line part. The insulating layer is disposed between the grounding layer and the pair of signal lines and separates the grounding layer from the pair of signal lines.

5 Claims, 2 Drawing Sheets

CIRCUIT BOARD

BACKGROUND

Technical Field

The disclosure relates to a circuit board, and in particular to a circuit board with a filtering effect.

Description of Related Art

As science and technology improve continuously, the development of various electronic products has become faster. At the same time, in response to the increase in computing speed of the electronic products, the use of high-frequency signals has also become more frequent. How to ensure transmission quality of the high-frequency signals and avoid mutual interference without increasing the size of the electronic products has become a problem that needs to be addressed.

SUMMARY

The disclosure provides a circuit board, which can solve problems caused by high-frequency signals.

The circuit board of the disclosure includes a grounding layer, a pair of signal lines and an insulating layer. The grounding layer has a void region. The void region includes a first straight line part, a second straight line part and a third straight line part. The second straight line part and the third straight line part are respectively connected to two ends of the first straight line part. An orthogonal projection of the pair of signal lines on the grounding layer crosses the first straight line part. The insulating layer is disposed between the grounding layer and the pair of signal lines and separates the grounding layer from the pair of signal lines.

In an embodiment of the disclosure, the orthogonal projection of the pair of signal lines on the grounding layer is perpendicular to the first straight line part.

In an embodiment of the disclosure, the orthogonal projection of the pair of signal lines on the grounding layer is parallel to the second straight line part and the third straight line part.

In an embodiment of the disclosure, the second straight line part and the third straight line part respectively extend in opposite directions from the two ends of the first straight line part.

In an embodiment of the disclosure, the second straight line part and the third straight line part have a same length.

In an embodiment of the disclosure, there are a plurality of the void regions, and there are a plurality pairs of the signal lines, and the orthogonal projection of each pair of signal lines on the grounding layer crosses the first straight line part of the corresponding void region.

Based on the above, in the circuit board of the disclosure, a good filtering effect can be achieved simply by including three straight line parts in the void region, and the space required is small.

DESCRIPTION OF THE EMBODIMENTS

Figure 1:
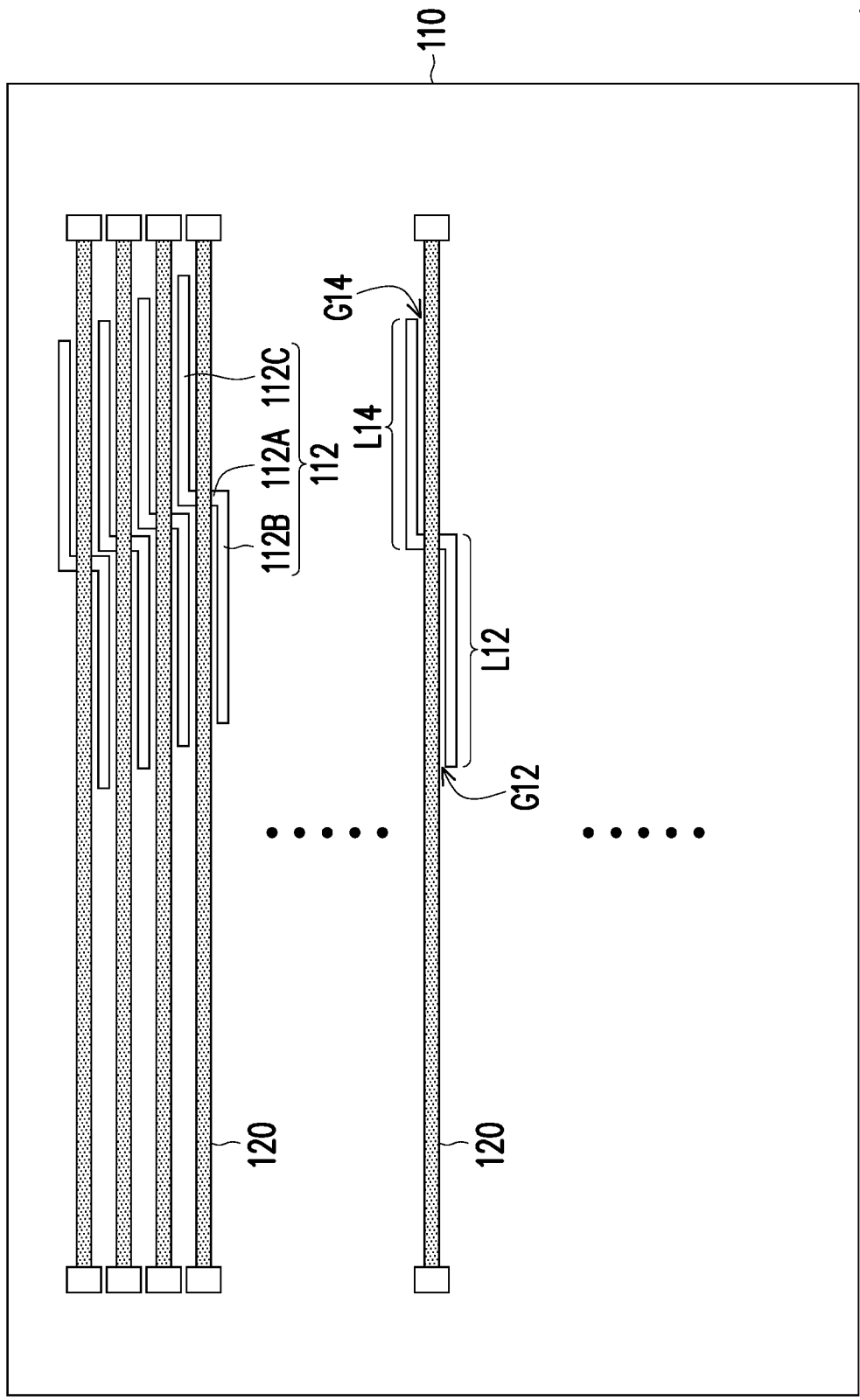
FIG. 1 is a schematic top diagram of a circuit board according to an embodiment of the disclosure.
Figure 2:
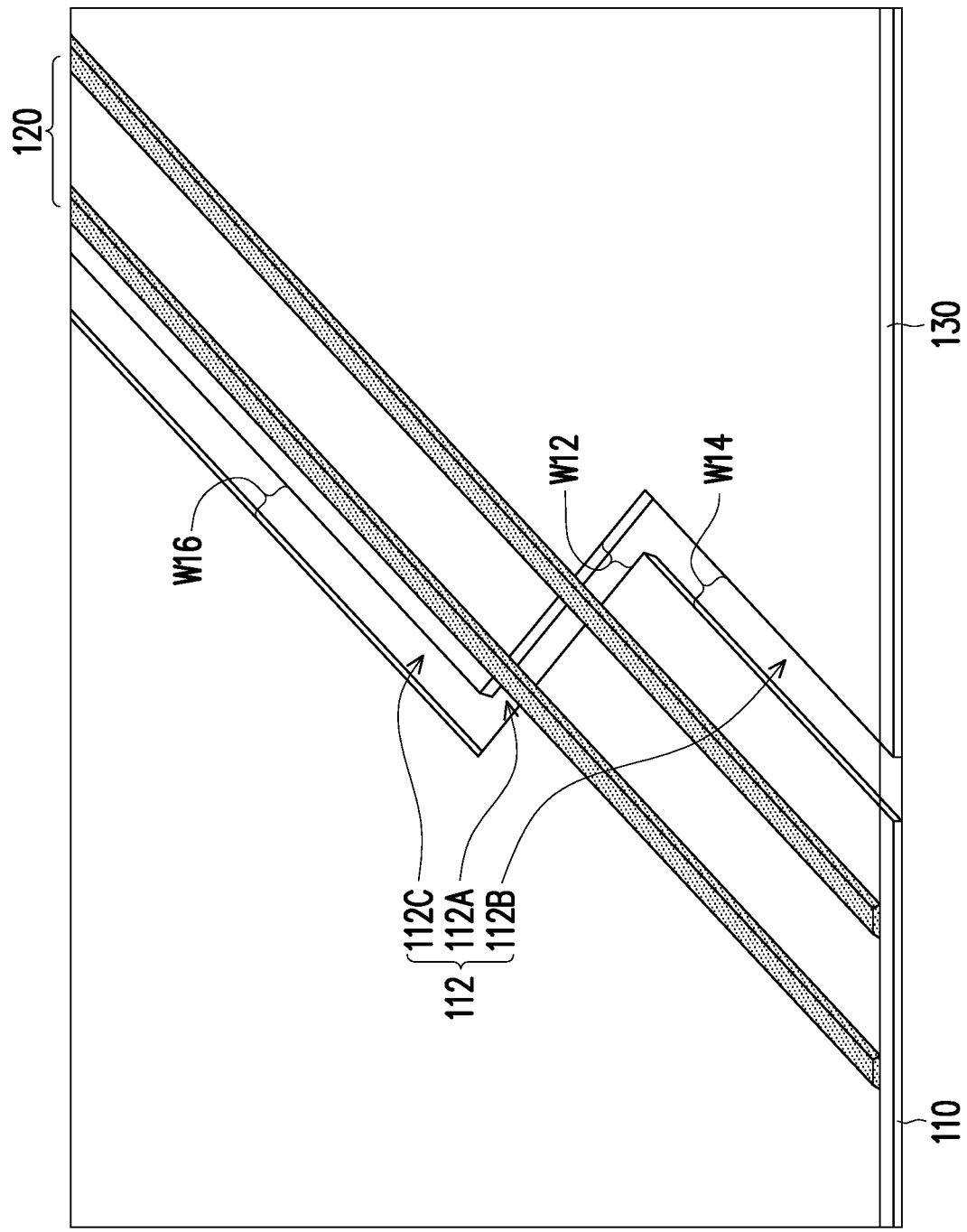
FIG. 2 is a partially enlarged perspective diagram of the circuit board of FIG. 1.

FIG. 1 is a schematic top diagram of a circuit board according to an embodiment of the disclosure. FIG. 2 is a partially enlarged perspective diagram of the circuit board of FIG. 1. Please refer to FIG. 1 and FIG. 2. A circuit board 100 of the embodiment includes a grounding layer 110, a pair of signal lines 120, and an insulating layer 130. The grounding layer 110 has a void region 112. The void region 112 includes a first straight line part 112A, a second straight line part 112B, and a third straight line part 112C. The second straight line part 112B and the third straight line part 112C are respectively connected to two ends of the first straight line part 112A. An orthogonal projection of the pair of signal lines 120 on the grounding layer 110 crosses the first straight line part 112A. The insulating layer 130 is disposed between the grounding layer 110 and the pair of signal lines 120 and separates the grounding layer 110 from the pair of signal lines 120.

The pair of signal lines 120 of the embodiment is, for example, configured to transmit high-frequency signals, and the signal line is connected between a high-frequency signal receiver and transmitter, wherein the high-frequency signal receiver or transmitter can be connected to a plurality of signal lines corresponding to the corresponding high-frequency signal receiver or transmitter, wherein the plurality of signal lines can correspond to the structure of the disclosure, and the void region 112 of the grounding layer 110 can effectively isolate an interference of electromagnetic waves that may overflow from the pair of signal lines 120, and can also effectively prevent the pair of signal lines 120 from being interfered by external electromagnetic waves. Compared with a conventional technique that requires modular filter elements to be installed on a circuit board, the circuit board 100 of the embodiment can be reduced in size and cost. In addition, the void region 112 in the embodiment occupies a small area, which can effectively increase the density of lines on the circuit board 100 in the embodiment.

In the embodiment, the orthogonal projection of the pair of signal lines 120 on the grounding layer 110 may be perpendicular to the first straight line part 112A. In addition, the orthogonal projection of the pair of signal lines 120 on the grounding layer 110 may be parallel to the second straight line part 112B and the third straight line part 112C. In other words, viewed from the normal direction of the grounding layer 110, the second straight line part 112B extends alongside the pair of signal lines 120 on one side of the pair of signal lines 120, and then the first straight line part 112A that is connected to the second straight line part 112B crosses the pair of signal lines 120, and then the third straight line section 112C that is connected to the first straight line part 112A extends alongside the pair of signal lines 120 on the other side of the pair of signal lines 120. In addition, the second straight line part 112B and the third straight line part 112C of the embodiment, for example, respectively extend in opposite directions from the two ends of the first straight line part 112A.

Basically, the void region 112 in the embodiment may be formed by only the first straight line part 112A, the second straight line part 112B, and the third straight line part 112C, without other additional parts. In other words, the structure of the void region 112 of the embodiment is simple and occupies a small part of the wiring area of the circuit board 100.

In the embodiment, the length L12 of the second straight line part 112B and the length L14 of the third straight line part 112C are, for example, equal. A gap G12 between the second straight line part 112B and the pair of signal lines 120 and a gap G14 between the third straight line part 112C and the pair of signal lines 120 are, for example, between one-half of the signal wavelength and a plurality of signal line widths; this value can be determined according to parameters such as dielectric coefficient of material of the insulating layer 130 and target filter frequency band. A line width W12 of the first straight line part 112A, a line width W14 of the second straight line part 112B, and a line width W16 of the third straight line part 112C are, for example, between one-half of the signal wavelength and a plurality of signal line widths; this value can be determined according to parameters such as the dielectric coefficient of the material of the insulating layer 130 and the target filter frequency band.

In the embodiment, there are a plurality of the void regions 112, and there are a plurality pairs of the signal lines 120. The orthogonal projection of each pair of signal lines 120 on the grounding layer 110 crosses the first straight line part 112A of the corresponding void region 112. In other words, when there are a plurality pairs of signal lines 120 on the circuit board in the embodiment, only a corresponding number of the void regions 112 need to be disposed. In addition, each pair of signal lines 120 in the embodiment corresponds to a void region 112, but the disclosure is not limited to this. In addition, the space between two adjacent pairs of signal lines 120 can be shared by the second straight line part 112B and the third straight line part 112C of the two adjacent void regions 112. For example, a second straight line part 112B of one void region 112 and a third straight line part 112C of another void region 112 may extend on a same straight line. Therefore, the wiring space occupied can be further reduced, and the area of the circuit board 100 can be thus reduced.

In summary, in the circuit board of the disclosure, a filtering effect of a common mode filter (CMF) can be exerted simply by including three straight line parts in a void region, which not only occupies only a small space and a small wiring area, but also saves cost.

What is claimed is:

1. A circuit board, comprising:
   a grounding layer, which has a void region, wherein the void region includes a first straight line part, a second straight line part, and a third straight line part, wherein the second straight line part and the third straight line part are respectively connected to two ends of the first straight line part, the second straight line part and the third straight line part respectively extend in opposite directions from the two ends of the first straight line part;
   a pair of signal lines, wherein an orthogonal projection of the pair of signal lines on the grounding layer crosses the first straight line part; and
   an insulating layer, disposed between the grounding layer and the pair of signal lines and separating the grounding layer from the pair of signal lines.

2. The circuit board according to claim 1, wherein the orthogonal projection of the pair of signal lines on the grounding layer is perpendicular to the first straight line part.

3. The circuit board according to claim 1, wherein the orthogonal projection of the pair of signal lines on the grounding layer is parallel to the second straight line part and the third straight line part.

4. The circuit board according to claim 1, wherein the second straight line part and the third straight line part have a same length.

5. The circuit board according to claim 1, wherein there are a plurality of the void regions, there are a plurality pairs of the signal lines, and the orthogonal projection of each pair of the plurality pairs of the signal lines on the grounding layer crosses the first straight line part of the corresponding void region.

* * * * *